(12) United States Patent
Cheng et al.

(10) Patent No.: US 12,096,616 B2
(45) Date of Patent: Sep. 17, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Ming Cheng, Hefei (CN); Xing Jin, Hefei (CN); Ran Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 496 days.

(21) Appl. No.: 17/389,752

(22) Filed: Jul. 30, 2021

(65) Prior Publication Data

US 2022/0093605 A1 Mar. 24, 2022

Related U.S. Application Data

(63) Continuation of application No. PCT/CN2021/100205, filed on Jun. 15, 2021.

(30) Foreign Application Priority Data

Sep. 18, 2020 (CN) .......................... 202010988655.X

(51) Int. Cl.
*H10B 12/00* (2023.01)
(52) U.S. Cl.
CPC ......... *H10B 12/482* (2023.02); *H10B 12/315* (2023.02)
(58) Field of Classification Search
CPC . H10B 12/482; H10B 12/315; H10B 12/0335
See application file for complete search history.

(56) References Cited

U.S. PATENT DOCUMENTS

| | | |
|---|---|---|
| 8,198,189 B2 | 6/2012 | Kim |
| 8,344,517 B2 | 1/2013 | Kim |
| 8,697,525 B2 | 4/2014 | Kim |
| 8,828,829 B2 | 9/2014 | Joung et al. |
| 8,921,223 B2 | 12/2014 | Lee |
| 8,941,157 B2 | 1/2015 | Kim et al. |
| 9,165,859 B2 | 10/2015 | Lim et al. |
| 9,275,937 B2 | 3/2016 | Lee |
| 9,331,072 B2 | 5/2016 | Seo |
| 9,337,202 B2 | 5/2016 | Lim et al. |
| 9,356,073 B1 | 5/2016 | Kim |

(Continued)

FOREIGN PATENT DOCUMENTS

| | | |
|---|---|---|
| CN | 1855511 A | 11/2006 |
| CN | 102543944 A | 7/2012 |

(Continued)

*Primary Examiner* — Kyoung Lee
*Assistant Examiner* — Sophia W Kao
(74) *Attorney, Agent, or Firm* — Kilpatrick Townsend & Stockton LLP

(57) ABSTRACT

An embodiment of the disclosure provides a semiconductor structure and a manufacturing method thereof. The semiconductor structure includes: a substrate, a bit line structure located on the substrate, a capacitor contact hole located on two opposite sides of the bit line structure, and an isolation sidewall. The isolation sidewall is located between the bit line structure and the capacitor contact hole. A gap is provided between the isolation sidewalls located on the two opposite sides of the bit line structure. The gap is located on the bit line structure.

6 Claims, 13 Drawing Sheets

(56) References Cited

U.S. PATENT DOCUMENTS

| | | |
|---|---|---|
| 9,379,004 B1 | 6/2016 | Kwon et al. |
| 9,419,000 B2 * | 8/2016 | Kim .................. H01L 23/53295 |
| 9,576,895 B2 | 2/2017 | Lee |
| 9,786,598 B2 | 10/2017 | Kim et al. |
| 9,911,851 B2 | 3/2018 | Seo |
| 10,411,014 B2 | 9/2019 | Hwang et al. |
| 10,475,794 B1 | 11/2019 | Wu et al. |
| 2010/0285662 A1 | 11/2010 | Kim |
| 2012/0168899 A1 | 7/2012 | Kim |
| 2012/0217631 A1 | 8/2012 | Kim |
| 2013/0093093 A1 * | 4/2013 | Lee ...................... H10B 12/315 257/E21.585 |
| 2014/0175659 A1 * | 6/2014 | Lee ......................... H01L 23/48 257/773 |
| 2014/0179102 A1 | 6/2014 | Joung et al. |
| 2014/0217545 A1 | 8/2014 | Kim et al. |
| 2014/0299989 A1 | 10/2014 | Lim et al. |
| 2015/0076693 A1 | 3/2015 | Lee |
| 2015/0214220 A1 | 7/2015 | Seo |
| 2016/0005743 A1 | 1/2016 | Lim et al. |
| 2016/0027727 A1 | 1/2016 | Kim et al. |
| 2016/0133564 A1 | 5/2016 | Lee |
| 2016/0172304 A1 | 6/2016 | Lee et al. |
| 2016/0181143 A1 | 6/2016 | Kwon et al. |
| 2016/0204262 A1 | 7/2016 | Seo |
| 2016/0211215 A1 * | 7/2016 | Lee ..................... H01L 23/5222 |
| 2016/0225710 A1 * | 8/2016 | Hwang ............. H01L 21/02164 |
| 2016/0329337 A1 | 11/2016 | Hwang et al. |
| 2017/0062347 A1 * | 3/2017 | Kim ................... H01L 29/0649 |
| 2022/0139924 A1 * | 5/2022 | Liao ................. H01L 21/76897 257/296 |
| 2023/0056204 A1 * | 2/2023 | Chen .................. H01L 23/5283 |

FOREIGN PATENT DOCUMENTS

| | | |
|---|---|---|
| CN | 103903994 A | 7/2014 |
| CN | 105280608 A | 1/2016 |
| CN | 105719998 A | 6/2016 |
| CN | 106941097 A | 7/2017 |
| CN | 110581103 A | 12/2019 |
| CN | 111584489 A | 8/2020 |
| KR | 20190037845 A | 4/2019 |

* cited by examiner

SEMICONDUCTOR STRUCTURE AND MANUFACTURING METHOD THEREOF

CROSS-REFERENCE TO RELATED APPLICATION

This application is a continuation of International patent application No. PCT/CN2021/100205, filed on Jun. 15, 2021, which is filed based upon and claims priority to Chinese patent application No. 202010988655.X, filed on Sep. 18, 2020. The contents of International patent application No. PCT/CN2021/100205 and Chinese patent application No. 202010988655.X are incorporated herein by reference in their entireties.

TECHNICAL FIELD

Embodiments of the disclosure relate to the field of semiconductors, and in particular to a semiconductor structure and a manufacturing method thereof.

BACKGROUND

As the feature size of a semiconductor integrated circuit is reduced continuously, a higher demand is placed on a manufacturing process of a dynamic random access memory (DRAM).

Specifically, as the feature size is reduced continuously, the space between adjacent conductors becomes smaller and smaller, and the thickness of a dielectric layer for isolating the adjacent conductors becomes thinner and thinner. In the case that a dielectric constant of the dielectric layer is constant, the thinner the thickness of the dielectric layer, the more serious the problem of parasitic capacitance between the adjacent conductors.

SUMMARY

In a first aspect, an embodiment of the disclosure provides a semiconductor structure, which includes: a substrate, a bit line structure located on the substrate, capacitor contact holes located on two opposite sides of the bit line structure; and isolation sidewalls. The isolation sidewalls are located between the bit line structure and the capacitor contact holes. A gap is provided between the isolation sidewalls located on the two opposite sides of the bit line structure. The gap is located on the bit line structure.

In a second aspect, an embodiment of the disclosure further provides a manufacturing method of a semiconductor structure, which includes: providing a substrate, and sequentially stacking a bit line structure and a first sacrificial layer on the substrate, capacitor contact holes being located on two opposite sides of the bit line structure; forming an isolation sidewall covering a sidewall of the bit line structure and a sidewall of the first sacrificial layer; and removing the first sacrificial layer to form a gap.

BRIEF DESCRIPTION OF THE DRAWINGS

One or more embodiments are exemplarily described with the pictures in the corresponding accompanying drawings. The exemplary description does not limit the embodiments. Unless otherwise specified, the pictures in the accompanying drawings do not limit the scale.

DETAILED DESCRIPTION

In order to make the objects, technical solutions, and advantages of the embodiments of the disclosure clearer, various embodiments of the disclosure will be described below in combination with the drawings in detail. However, those of ordinary skill in the art can understand that, in various embodiments of the disclosure, many technical details are proposed to make readers understand the disclosure better. However, the technical solutions claimed by the disclosure may also be implemented even without these technical details and various variations and modifications made based on the following embodiments.

FIG. 1 to FIG. 13 are structural schematic diagrams corresponding to various operations of a manufacturing method of a semiconductor structure provided by an embodiment of the disclosure.

Figure 1:
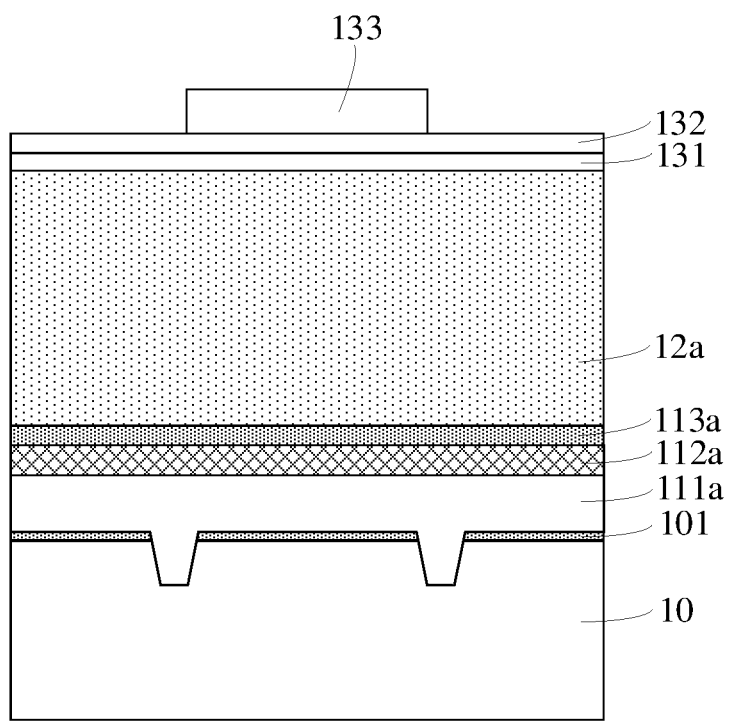
FIG. 1 to FIG. 13 are structural schematic diagrams corresponding to various operations of a manufacturing method of a semiconductor structure provided by an embodiment of the disclosure.

Referring to FIG. 1, a substrate 10 is provided, and a bottom dielectric film 101, a first conductive film 111a, a second conductive film 112a, a top dielectric film 113a, a first sacrificial film 12a, a first mask layer 131, a second mask layer 132, and a third mask layer 133 are sequentially stacked on the substrate 10.

The bottom dielectric film 101 is configured to isolate the first conductive film 111a and an active area (not shown in figures) in the substrate 10. The material of the bottom dielectric film 101 includes silicon nitride. A part of the first conductive film 111a is in contact with the active area to serve as bit line contact. The material of the first conductive film 111a includes polysilicon. The material of the second conductive film 112a includes tungsten. The top dielectric film 113a functions as a dielectric layer and protects the second conductive film 112a. The material of the top dielectric film 113a includes silicon nitride.

In the same etching process, the material of the first sacrificial film 12a and the material of the top dielectric film 113a have relatively large etching selection ratio, so that the top dielectric film 113a has a better protection effect, and the second conductive film 112a is prevented from being damaged by the etching process aiming at the first sacrificial film 12a. The material of the first sacrificial film 12a includes silicon dioxide.

In the embodiment, a mask layer includes the first mask layer 131 and the second mask layer 132. The hardness of the first mask layer 131 is greater than the hardness of the second mask layer 132 so as to improve the etching precision of a subsequent etching process. In other embodiments, an anti-reflective coating is also provided between the first mask layer and the first sacrificial film to reduce problems such as reflection, standing wave, and the like.

The material of the first mask layer 131 may include silicon nitride. The material of the second mask layer 132 may include polysilicon. The anti-reflective coating is typically a carbon coating.

In the embodiment, the third mask layer 133 is configured to limit a location of a bit line structure which is formed subsequently.

Figure 2:
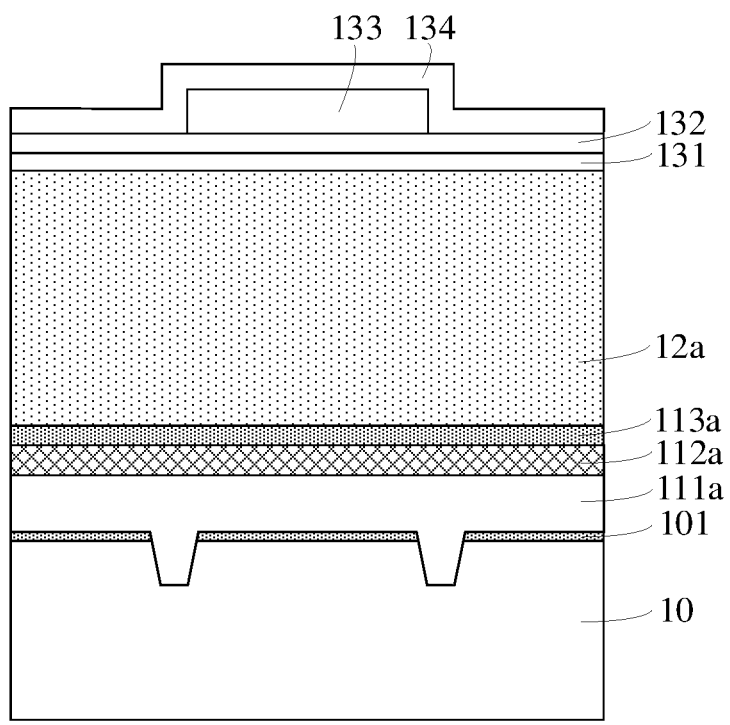

Referring to FIG. 2, a fourth mask layer 134 is formed, and the fourth mask layer 134 covers a top surface and a sidewall of the third mask layer 133 and a top surface of the second mask layer 132. The fourth mask layer 134 is configured to limit a width of the bit line structure in a direction parallel to the substrate 10.

Figure 3:
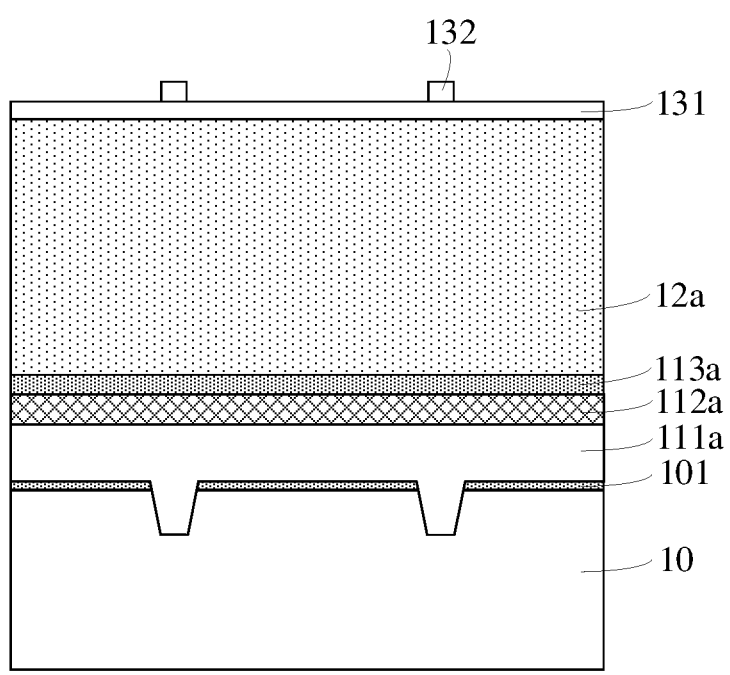

Referring to FIG. 3, the second mask layer 132 is etched by adopting a self-aligned double patterning (SADP) technique, and the width of the remaining second mask layer 132 is equal to the width of the fourth mask layer 134 (referring to FIG. 2) covering the sidewall of the third mask layer 133 (referring to FIG. 2). The remaining second mask layer 132 serves as a mask for etching to form the bit line structure, and the width of the remaining second mask layer 132 is equal to the width of the bit line structure which is formed subsequently.

Figure 4:
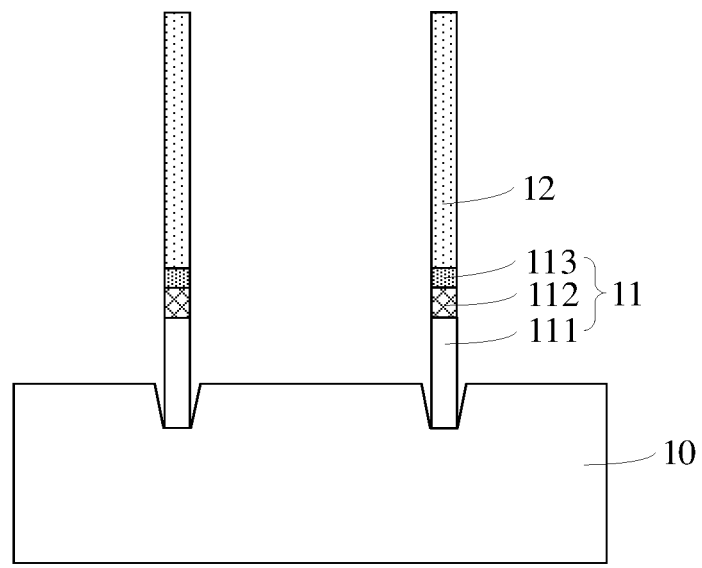

Referring to FIG. 4, the first sacrificial film 12a, the top dielectric film 113a, the second conductive film 112a, the first conductive film 111a, and the bottom dielectric film 101 (referring to FIG. 3) are etched through the remaining second mask layer 132 to form the bit line structure 11 and a first sacrificial layer 12 located on the bit line structure 11.

In the embodiment, the bit line structure 11 includes a bottom dielectric layer (not shown in figures), a conductive layer, and a top dielectric layer 113. The conductive layer includes a first conductive layer 111 and a second conductive layer 112. In other embodiments, the conductive layer may include a single conductive layer or more than two conductive layers.

Figure 5:
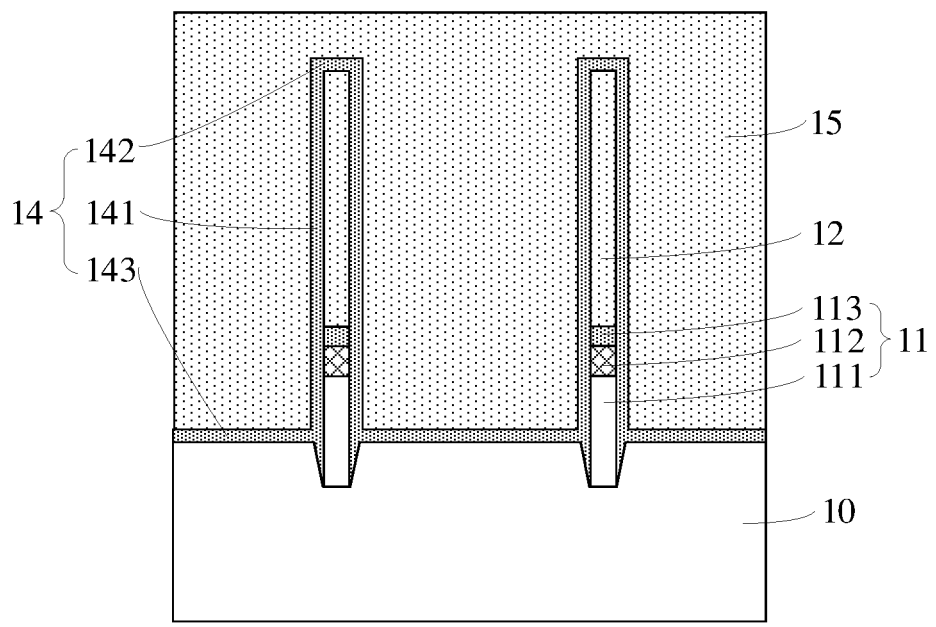

Referring to FIG. 5, an isolation film 14 and a second sacrificial layer 15 are formed by adopting a deposition process, the isolation film 14 covers sidewalls of the bit line structure 11 and the first sacrificial layer 12, and the second sacrificial layer 15 is filled between the adjacent bit line structures 11.

In the embodiment, the isolation film 14 includes an isolation sidewall(s) 141 covering the sidewall of the bit line structure 11 and the sidewall of the first sacrificial layer 12, a top isolation layer 142 covering a top surface of the first sacrificial layer 12, and a bottom isolation layer 143 covering a surface of the substrate 10. The isolation sidewall 141 functions as isolation and support, and the bottom isolation layer 143 may protect the substrate 10 in an etching process of subsequently etching the second sacrificial layer 15.

In the embodiment, the second sacrificial layer 15 and the first sacrificial layer 12 are the same in material, so that the first sacrificial layer 12 and the second sacrificial layer 15 in a designated region may be rapidly removed by adopting the same etchant, and the process efficiency is improved.

In addition, in the embodiment, a top surface of the second sacrificial layer 15 is higher than a top surface of the isolation sidewall 141. In other embodiments, the top surface of the second sacrificial layer is flush with or lower than the top surface of the isolation sidewall.

Figure 6:
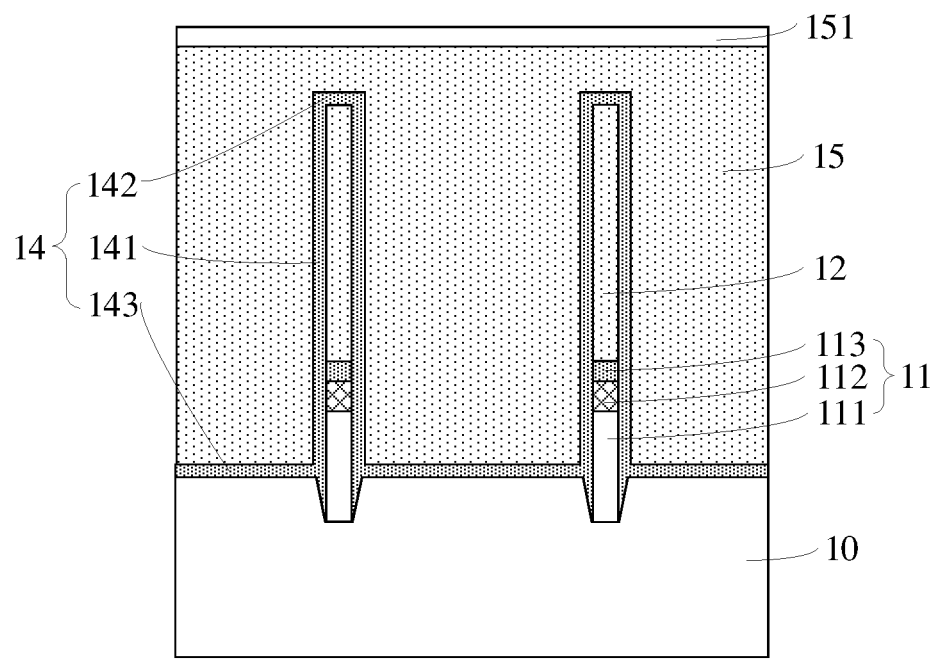
Figure 7:
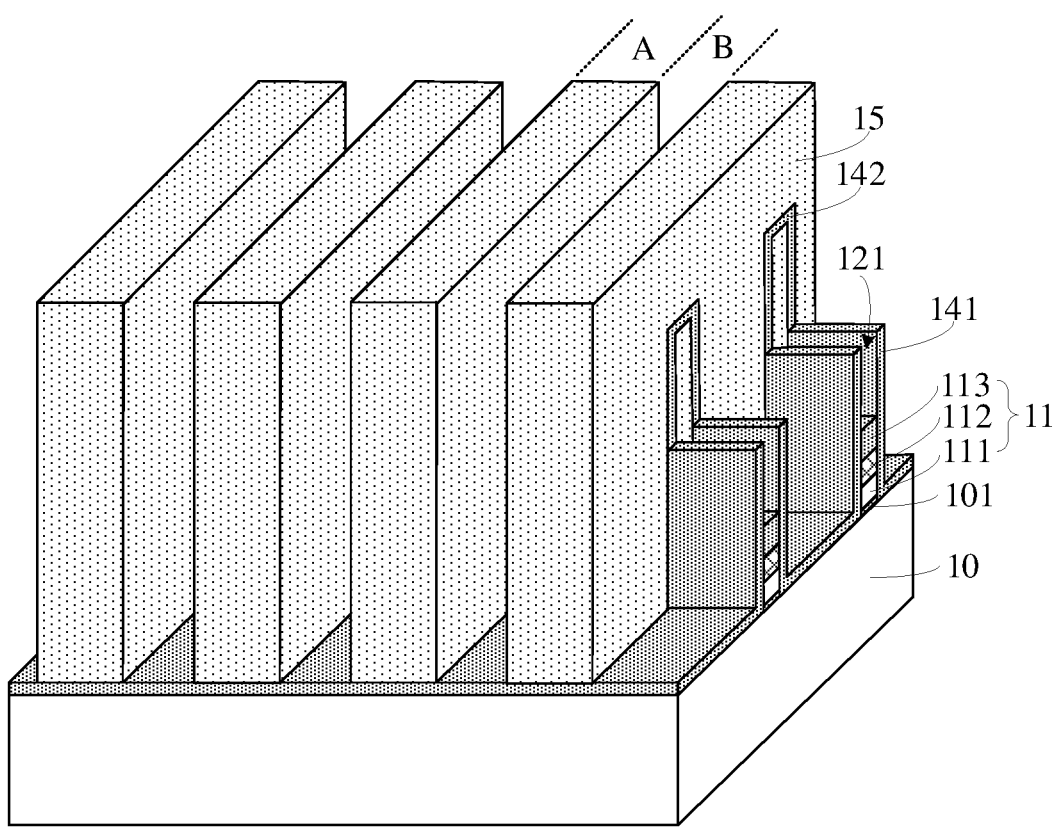

Referring to FIG. 6 and FIG. 7, a fifth mask layer 151 is formed, and a dry etching process is performed through the fifth mask layer 151.

In the embodiment, in an extension direction parallel to the bit line structure 11, the substrate 10 may be divided into a first region A and a second region B arranged at intervals. The first region A between the adjacent bit line structures 11 is configured to form a capacitor contact hole(s) and fill a capacitor contact window(s). The second region B between the adjacent bit line structures 11 is configured to form the isolation layer(s). The isolation layer is configured to divide the capacitor contact hole and isolate the adjacent capacitor contact windows.

In the embodiment, the fifth mask layer 151 covers the top surface of the second sacrificial layer 15 of the first region A and exposes the top surface of the second sacrificial layer 15 of the second region B. Accordingly, the operation that the dry etching process is performed through the fifth mask layer 151 includes: the second sacrificial layer 15 of the second region B is removed, the top isolation layer 142 of the second region B is removed, and the first sacrificial layer 12 of the second region B is removed to form a first gap 121.

In the embodiment, the etchant of the dry etching process aims at the material of the first sacrificial layer 12 and the second sacrificial layer 15, so that during the dry etching process, since the etching rate of the second sacrificial layer 15 is relatively high, when the etchant etches the top isolation layer 142, the isolation sidewall 141 is gradually exposed. Meanwhile, since an angle of the dry etching process is not always perpendicular to the surface of the substrate 10 (a cause may be the cause set by the etching process itself and may also be the cause of the process stability), the etchant may etch the exposed isolation sidewall 141, so that not only the top isolation layer 142 is removed, but also a part of the isolation sidewall 141 is removed in the dry etching process.

In the direction perpendicular to the surface of the substrate 10, the thickness of the removed isolation sidewall 141 is related to the etching selection ratio of the second sacrificial layer 15 and the isolation film 14 (referring to FIG. 5). Specifically, in the dry etching process, the greater the etching selection ratio of the second sacrificial layer 15 and the isolation film 14, the thinner the isolation sidewall 141 is removed, and the thicker the thickness of the remaining isolation sidewall 141.

Figure 8:
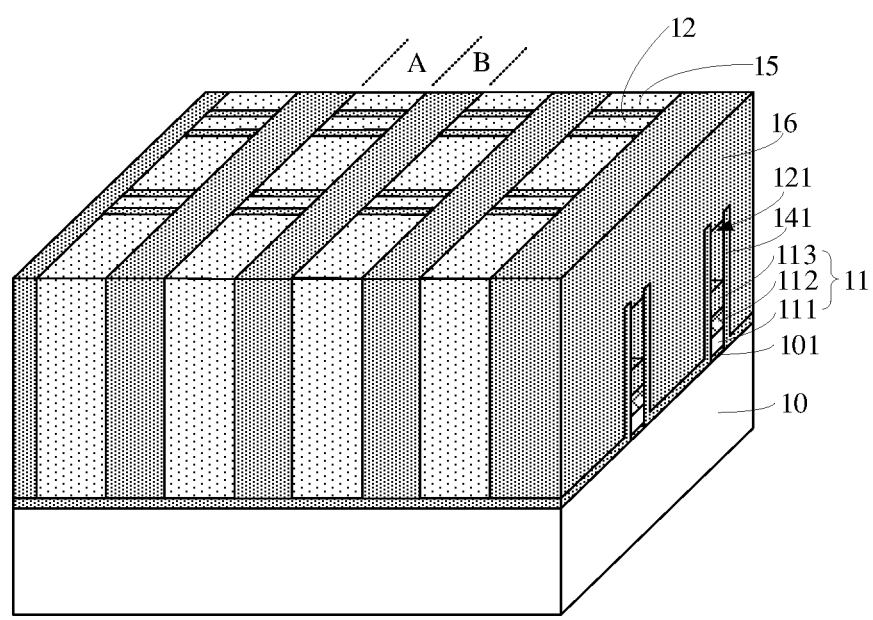

Referring to FIG. 8, the deposition process and a planarization process are performed.

In the embodiment, before the deposition process is performed, the fifth mask layer 151 is removed, so that a grinding device is prevented from contact with at least three kinds of material (the material of the fifth mask layer 151, the material of the second sacrificial layer 15, and the material deposited by the deposition process) during the subsequent planarization process. Therefore, the influence of a concave-convex structure formed due to relatively great difference in the removal rate of different materials on the grinding device is avoided, thereby ensuring that the grinding device has relatively long service life. Or it is unnecessary to replace grinding liquid or a mask component midway to avoid the great difference in the removal rate, therefore, the process efficiency is improved.

In other embodiments, the fifth mask layer is reserved when the deposition process is performed, and the fifth mask layer and other film layers are subsequently removed simultaneously by adopting the planarization process. Therefore, the reduction of the process operation and a process period is facilitated.

In the embodiment, the deposition process is configured to form a sealing layer 16. The sealing layer 16 includes a first sealing layer (not shown) for sealing the first gap 121 and an isolation layer (not shown) for isolating the adjacent capacitor contact windows, that is, the first sealing layer and the isolation layer are formed simultaneously in the same deposition process.

In the embodiment, in the planarization process, the top isolation layer 142 of the first region A is removed (referring to FIG. 7) to expose the first sacrificial layer 12, thereby facilitating the subsequent removal of the first sacrificial layer 12.

Figure 9:
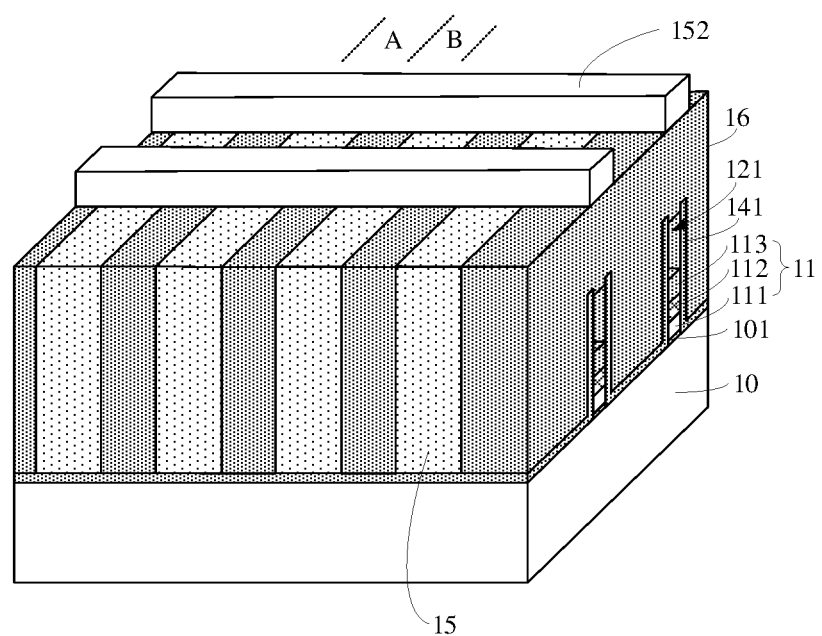

Referring to FIG. 9, a sixth mask layer 152 is formed to etch the remaining second sacrificial layer 15.

In the embodiment, the second sacrificial layer 15 is etched first to form the capacitor contact hole and fill the capacitor contact window, and then the remaining first sacrificial layer 12 is etched to form a second gap (not shown), thereby forming a second sealing layer (not shown)

for sealing the second gap. Since the second sealing layer is typically thin, if the second sealing layer is formed first and then a maskless etching process is performed on the second sacrificial layer 15, the thickness of the second sealing layer is liable to further reduce, and therefore, the problems of collapse and the like due to weak bearing capacity occur subsequently.

The sixth mask layer 152 covers at least the top surface of the first sacrificial layer 12 (referring to FIG. 8).

Figure 10:
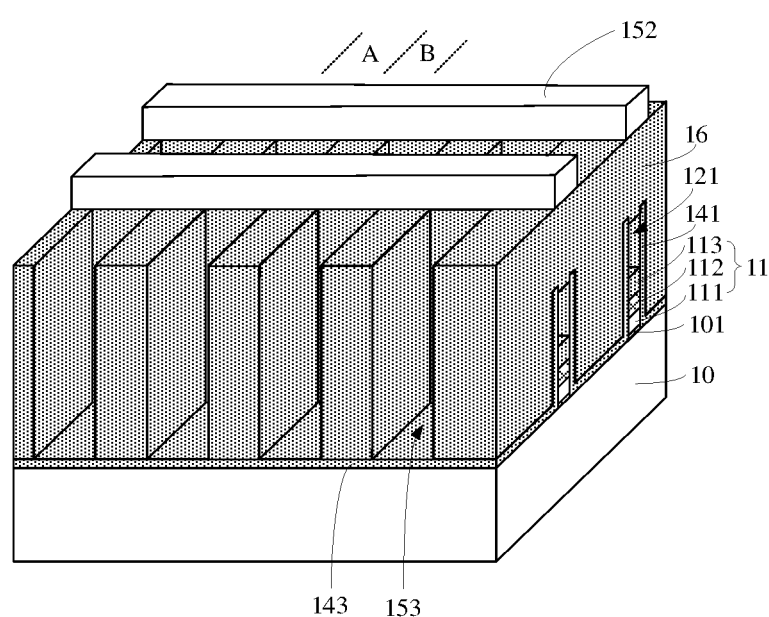

Referring to FIG. 10, the remaining second sacrificial layer 15 is etched away (referring to FIG. 9).

In the embodiment, the remaining second sacrificial layer 15 is removed to form an initial capacitor contact hole 153. It is to be noted that to form the capacitor contact hole so that the capacitor contact window filled in the capacitor contact hole is in contact with an active region in the substrate 10, it is also necessary to remove the bottom isolation layer 143 between the initial capacitor contact hole 153 and the substrate 10 so that the capacitor contact hole exposes the substrate 10.

In the embodiment, after the second sacrificial layer 15 is removed, the bottom isolation layer 143 between the initial capacitor contact hole 153 and the substrate 10 is further removed to form the capacitor contact hole.

Figure 11:
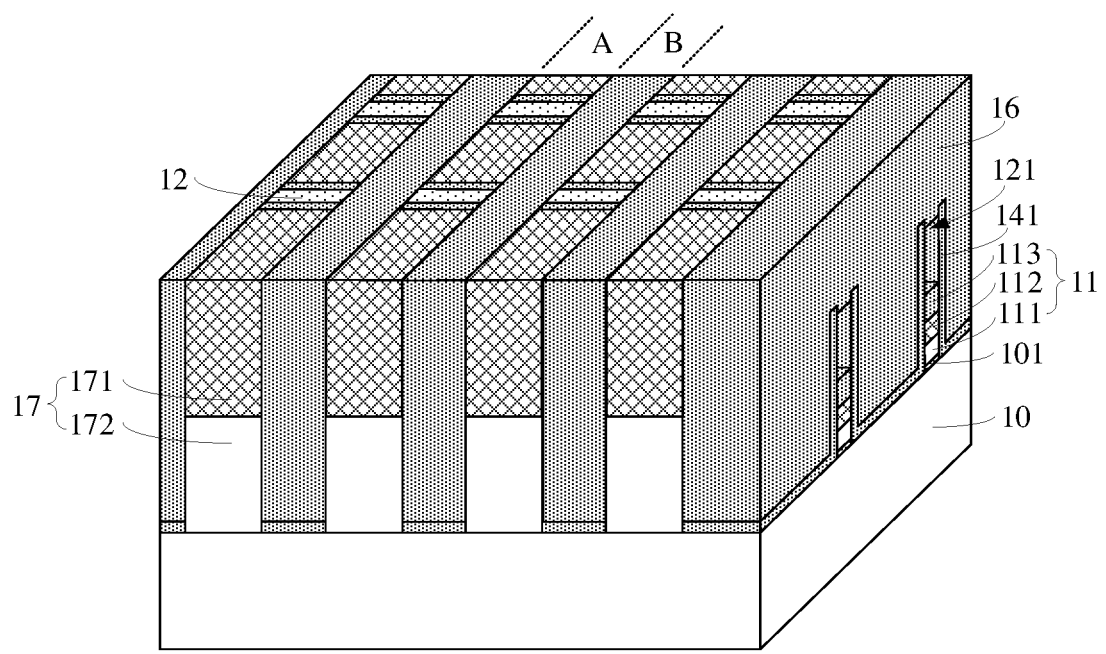
Figure 12:
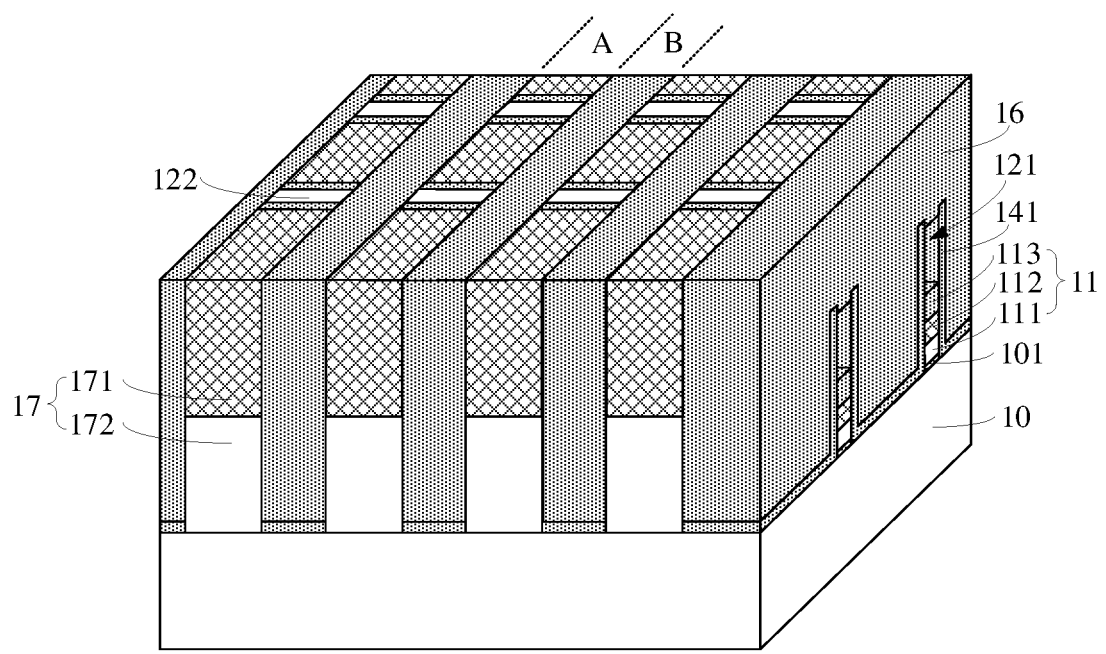

Referring to FIG. 11 and FIG. 12, the capacitor contact window 17 is formed and the remaining first sacrificial layer 12 is removed to form the second gap 122.

In the embodiment, the capacitor contact window 17 includes a first capacitor contact window 171 located at the top and a second capacitor contact window 172 located at the bottom. The contact resistance of the second capacitor contact window 172 and the substrate 10 is smaller than the contact resistance of the first capacitor contact window 171 and the substrate 10. Therefore, the signal transmission performance is improved.

In the embodiment, the second gap 122 is located between the adjacent first gaps 121, the second gap 122 is communicated with the first gap 121, the second gap 122 and the first gap 121 form a gap, and a top surface of the second gap 122 is higher than a top surface of the first gap 121.

Figure 13:
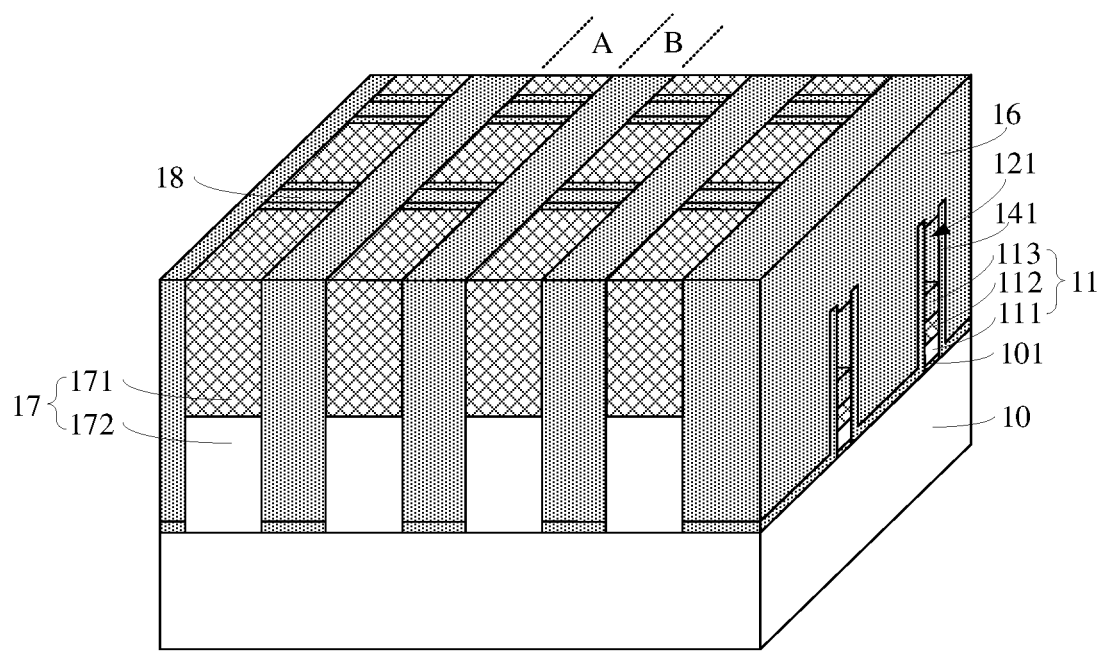

Referring to FIG. 13, the second sealing layer 18 for sealing the second gap is formed, and the second sealing layer 18 and the first sealing layer together form a sealing layer.

In the embodiment, the gap is provided between the adjacent capacitor contact holes, so that a dielectric constant of the dielectric layer for isolating the adjacent capacitor contact windows is reduced, the parasitic capacitance between the adjacent capacitor contact windows is reduced, and the signal transmission rate of the capacitor contact window is improved.

Correspondingly, an embodiment of the disclosure further provides a semiconductor structure which may be manufactured by adopting the above manufacturing method of a semiconductor structure.

Referring to FIG. 13, the semiconductor structure includes: a substrate 10, a bit line structure 11 located on the substrate 10, and capacitor contact holes located on two opposite sides of the bit line structure 11, and isolation sidewalls 141. The isolation sidewall 141 is located between the bit line structure 11 and the capacitor contact hole. A gap is provided between the isolation sidewalls 141 located on the two opposite sides of the bit line structure 11. The gap is located on the bit line structure 11.

In the embodiment, the gap includes a second gap between the opposite capacitor contact holes, and a first gap 121 located between the adjacent second gaps in a direction parallel to an extension direction of the bit line structure 11. Furthermore, a top surface of the second gap is higher than a top surface of the first gap 121 in a direction perpendicular to a surface of the substrate 10.

In the embodiment, the semiconductor structure further includes isolation layers. The isolation layers are located on two opposite sides of the bit line structure 11. The isolation layer is configured to isolate the adjacent capacitor contact holes. The first gap 121 is located between the opposite isolation layers.

In the embodiment, the semiconductor structure further includes a sealing layer. The sealing layer includes a first sealing layer configured to seal the first gap 121 and a second sealing layer 18 configured to seal the second gap.

In the embodiment, a thickness of the gap in the direction perpendicular to the surface of the substrate 10 is smaller than or equal to 100 nm, for example, 85 nm, 90 nm, or 95 nm. Therefore, structural collapse caused by the fact that the gap cannot provide support is avoided, and the semiconductor structure is guaranteed to have better structural stability.

In the embodiment, the gap is provided between the adjacent capacitor contact holes, so that a dielectric constant of a dielectric layer for isolating the adjacent capacitor contact windows is reduced, further, parasitic capacitance between the adjacent capacitor contact windows is reduced, and signal transmission rate of the capacitor contact windows is improved.

Those of ordinary skill in the art can understand that each implementation mode is a specific embodiment implementing the disclosure, and in practical applications, various variations about the forms and details can be made thereto without departing from the spirit and scope of the disclosure. Any skilled in the art can make various changes and modifications without departing from the spirit and scope of the disclosure, and therefore the protection scope of the disclosure should be limited by the scope of the claims.

The invention claimed is:

1. A manufacturing method of a semiconductor structure, comprising:
   providing a substrate, and sequentially stacking a bit line structure and a first sacrificial layer on the substrate, wherein capacitor contact holes are located on two opposite sides of the bit line structure, and the first sacrificial layer is located on the bit line structure;
   forming an isolation sidewall covering a sidewall of the bit line structure and a sidewall of the first sacrificial layer; and
   removing the first sacrificial layer to form a gap, wherein the gap is located on the bit line structure.

2. The manufacturing method of a semiconductor structure of claim 1, wherein a top surface of the first sacrificial layer is covered with a top isolation layer;
   wherein forming the gap comprises:
   filling a second sacrificial layer between the adjacent bit line structures;
   forming a first mask layer; and
   removing a part of the first sacrificial layer, a part of the top isolation layer, a part of the isolation sidewall and a part of the second sacrificial layer through the first mask layer in a same etching process to form a first gap.

3. The manufacturing method of a semiconductor structure of claim 2, after forming the first gap, wherein the method further comprises:
   forming an isolation layer located between the adjacent bit line structures and a first sealing layer for sealing a top opening of the first gap in a same deposition process.

4. The manufacturing method of a semiconductor structure of claim 3, after forming the isolation layer and the first sealing layer, wherein the method further comprises:
    removing a remaining part of the second sacrificial layer to form the capacitor contact holes; and
    filling the capacitor contact holes to form a capacitor contact window.

5. The manufacturing method of a semiconductor structure of claim 3, after forming the isolation layer and the first sealing layer, wherein the method further comprises:
    removing a remaining part of the first sacrificial layer to form a second gap;
    forming the gap by the first gap and the second gap;
    forming a second sealing layer for sealing a top opening of the second gap; and
    forming a sealing layer by the first sealing layer and the second sealing layer.

6. The manufacturing method of a semiconductor structure of claim 5, wherein removing the remaining part of the first sacrificial layer comprises:
    removing a remaining part of the top isolation layer by adopting a planarization process to expose the remaining part of the first sacrificial layer.

\* \* \* \* \*